United States Patent
Esterbauer et al.

(10) Patent No.: US 10,178,788 B2
(45) Date of Patent: Jan. 8, 2019

(54) INPUT AND OUTPUT DEVICE WITH FRAME

(71) Applicant: B&R INDUSTRIAL AUTOMATION GMBH, Eggelsberg (AT)

(72) Inventors: Hermann Esterbauer, Tarsdorf (AT); Johann Wimmer, Handenberg (AT)

(73) Assignee: B&R INDUSTRIAL AUTOMATION GMBH, Eggelsberg (AT)

( * ) Notice: Subject to any disclaimer, the term of this patent is extended or adjusted under 35 U.S.C. 154(b) by 0 days.

(21) Appl. No.: 15/319,616

(22) PCT Filed: Jun. 15, 2015

(86) PCT No.: PCT/EP2015/063336
§ 371 (c)(1),
(2) Date: Dec. 16, 2016

(87) PCT Pub. No.: WO2015/193238
PCT Pub. Date: Dec. 23, 2015

(65) Prior Publication Data
US 2017/0196111 A1    Jul. 6, 2017

(30) Foreign Application Priority Data

Jun. 18, 2014 (AT) .................................. 50426/2014

(51) Int. Cl.
*H05K 5/02*    (2006.01)
*H05K 7/18*    (2006.01)
(Continued)

(52) U.S. Cl.
CPC ............. *H05K 7/14* (2013.01); *G06F 1/1601* (2013.01); *G06F 1/1656* (2013.01); *G06F 3/041* (2013.01);
(Continued)

(58) Field of Classification Search
CPC .................................. H05K 7/14; H05K 7/18
(Continued)

(56) References Cited

U.S. PATENT DOCUMENTS

| | | | | |
|---|---|---|---|---|
| 4,720,606 A * | 1/1988 | Senn | ..................... | H05K 9/0015 |
| | | | | 174/356 |
| 7,545,458 B2 * | 6/2009 | Hsu | ................... | G02F 1/133308 |
| | | | | 349/58 |

(Continued)

FOREIGN PATENT DOCUMENTS

| | | |
|---|---|---|
| CN | 2555529 | 6/2003 |
| CN | 2844970 | 12/2006 |

(Continued)

OTHER PUBLICATIONS

Austria Search Report conducted in counterpart Austria Appln. No. A 50426/2014 (dated Mar. 27, 2015).

*Primary Examiner* — Hung S Bui
(74) *Attorney, Agent, or Firm* — Greenblum & Bernstein, P.L.C.

(57) ABSTRACT

In order to manufacture an input and output device industrial use as cost-effectively as possible, while also fulfilling the demanding requirements in an industrial environment, it is provided that the frame of the input and output device is assembled from a plurality of individual frame sections which are connected to one another at the corners in order to form the frame and which are firmly bonded at the adjoining connecting surfaces in order to form a fully sealed external front face of the frame and a fully sealed external peripheral surface of the frame.

9 Claims, 2 Drawing Sheets

(51) Int. Cl.
*H05K 7/14* (2006.01)
*H04N 5/64* (2006.01)
*H05K 5/00* (2006.01)
*H05K 7/00* (2006.01)
*G06F 1/16* (2006.01)
*G06F 3/041* (2006.01)

(52) U.S. Cl.
CPC .............. *H04N 5/64* (2013.01); *H05K 5/0017* (2013.01); *H05K 7/00* (2013.01); *H05K 7/18* (2013.01)

(58) Field of Classification Search
USPC ........................................................ 361/813
See application file for complete search history.

(56) References Cited

U.S. PATENT DOCUMENTS

| | | | | |
|---|---|---|---|---|
| 8,102,483 B2* | 1/2012 | Perry | ...................... | H05K 5/03 349/56 |
| 8,780,581 B2* | 7/2014 | Merz | ...................... | H01Q 1/243 361/799 |
| 8,913,395 B2* | 12/2014 | Myers | ................... | G06F 1/1626 361/732 |
| 9,161,167 B2 | 10/2015 | Schwaiger | | |
| 9,414,507 B2* | 8/2016 | Lv | ............................ | H05K 5/02 |
| 2005/0068469 A1* | 3/2005 | Kim | .................. | G02F 1/133308 349/58 |
| 2006/0061256 A1* | 3/2006 | Oroku | ..................... | H01J 9/242 313/496 |
| 2006/0066768 A1* | 3/2006 | Lee | .................. | G02F 1/133308 349/58 |
| 2009/0262512 A1 | 10/2009 | Chen et al. | | |
| 2013/0119167 A1 | 5/2013 | Schwaiger | | |

FOREIGN PATENT DOCUMENTS

| | | |
|---|---|---|
| CN | 201131097 | 10/2008 |
| CN | 201255876 | 6/2009 |
| CN | 201274618 | 7/2009 |
| CN | 202306513 | 7/2012 |
| CN | 202306514 | 7/2012 |
| CN | 202422070 | 9/2012 |
| CN | 202496007 | 10/2012 |
| CN | 203279402 | 11/2013 |
| CN | 203393093 | 1/2014 |
| DE | 102008025833 | 12/2009 |
| EP | 2590489 | 5/2013 |
| KR | 20050027375 | 3/2005 |
| KR | 20080042287 | 5/2008 |
| KR | 20090111015 | 10/2009 |

* cited by examiner

INPUT AND OUTPUT DEVICE WITH FRAME

CROSS-REFERENCE TO RELATED APPLICATIONS

The present application is a U.S. National Stage of International Patent Application No. PCT/EP2015/063336 filed Jun. 15, 2015, and claims priority under 35 U.S.C. § 119 and 365 of Austria Patent Application No. A 50426/2014 filed Jun. 18, 2014. Moreover, the disclosure of International Patent Application No. PCT/EP2015/063336 is expressly incorporated by reference herein in its entirety.

BACKGROUND OF THE INVENTION

1. Field of the Invention

The subject of the invention relates to an input and output device for industrial use with a frame which is sealed around the periphery (circumference) with a continuous central recess in which an input/output unit is set in, and a method for the manufacturing of such a frame and input and output device.

2. Discussion of Background Information

A majority of modern input and output devices as man-machine interfaces are based on display or touch screen technology as input and output units. Buttons, knobs, switches, etc. are also common as input and output units. This applies in particular and increasingly for industrial applications as well, e.g. for controlling machines and systems. Owing to increasing levels of automation, appropriate image rendering input and output devices such as displays, touch screens, etc. are common on machine tools, machining centres and processing machines, control cabinets, monitoring and control units for process and flow control, and the like.

Precisely thanks to the use of input and output devices in connection with industrial applications, the demands on such devices in an industrial environment with regard to mechanical robustness and resistance to external influences and situations rise accordingly. These requirements can in no way be compared with the demands on conventional input and output devices, in particular displays, as they exist in a private environment for monitors and televisions, for example.

In general, input and output devices for industrial use are designed with appropriately stable and durable housings or frames intended for these input and output devices. For this reason, device frames for input and output devices for industrial use are made from metal, typically aluminium.

In addition, there can also be requirements for the sealing tightness of input and output devices since there can often be spray in an industrial environment, against which the display must be sealed. During cleaning of a machine or system, too, there can be spray pressure against which the display must be protected.

Equally, there are often demands of a hygienic nature. In particular, this deals with options for preventing the accumulation of dirt on the display to the greatest extent possible. Above all, grooves, gaps and recesses on the display and on the display frame should be avoided here.

In order to be able to fulfil all these requirements, displays for industrial applications are manufactured, according to the current state of the art, with one-piece frames which house the display.

As a result of the low quantities of such displays for industrial use, these frames are manufactured, according to the current state of the art, through machining from the whole piece, for example through milling. Naturally, this results in very high material losses, which increases the costs for such display frames and also makes manufacturing time-consuming and inefficient.

In principle, such one-piece display frames could also be manufactured using die casting or injection moulding processes, but there is little prospect for this owing to the high tooling costs (e.g. for dies) as a result of the low production volumes.

A frame for an LCD display which is assembled from individual frame sections is known from CN 2844970 Y. Here, the frame sections are cut out from a panel of the display material, assembled to form a frame and the flat frame sections are joined at the joints (e.g. through soldering, welding or using rivets). The corners of the flat frame are then punched out and the sides are bent in order to form a frame with an L-shaped cross section. It is obvious that such a frame cannot be sealed at the corners at which the bent sides adjoin each other. Such a frame is therefore unsuitable for an industrial application.

A frame for a flat-screen display which is assembled from individual frame sections is also known from KR 10 2005 0027375 A. Here, the plastic frame sections are plastic components in the form of pressed parts which are fused at the joints. The frame has a recess at the corners, meaning that the frame is not sealed and is therefore not suitable for industrial use.

SUMMARY OF THE EMBODIMENTS

Embodiments of the present invention produce an input and output device for industrial use as cost-effectively as possible, which device also fulfils the above-specified requirements in an industrial environment.

In embodiments of the invention, the frame is assembled from a plurality of individual frame sections which are connected with one another at the corners in order to form the frame and are firmly bonded (substance-to-substance joint) at the connecting surfaces in order to form a fully enclosed front face of the frame and a fully enclosed external peripheral (circumferential) surface of the frame. Since a wide variety of profiles in a wide variety of embodiments are used for a wide variety of areas of application, these are widely available and appropriately cost-effective. Since hardly any waste and/or scrap is produced by the usual methods of production of the profiles, regardless of their material, an additional cost advantage applies. Thanks to the frame which is entirely externally sealed, the input and output device which is set into the frame can be appropriately protected, whereby the requirements can be fulfilled.

The firmly bonded joints represent cost-effective joining technology with a range of advantages. On the one hand, such joints generally allow for greater tolerances for the joined parts, and on the other hand the joint can also act as a seal at the same time. In addition, the joint can also ensure sufficient stability for the frame. Last but not least, substance-to-substance joining methods can be controlled easily and safely, leading to high process reliability in the production of the frames.

A glued joint, solder joint or welded joint is preferably used as the substance-to-substance joint for two frame sections adjoining one another.

The external appearance of the frame can be improved if at least two frame sections adjoining each other are mitred or dovetailed for forming the connecting surfaces at a corner of the frame. In addition, such connecting surfaces also simplify the automated, mechanical production of a frame.

For hygiene reasons, it is advantageous for any joining material which protrudes after joining to be removed from the external front face and/or the external peripheral surface through finishing. As a result, no dirt can accumulate there. The same effect can be achieved if a cover sheet which covers at least the bonding layer is glued over the external front face and/or the external peripheral surface, or the external front face and/or the external peripheral surface is painted or coated at least in the area of the bonding layer.

BRIEF DESCRIPTION OF THE DRAWINGS

The present invention is described below in more detail with reference to FIGS. 1 to 6 which show advantageous embodiments of the invention in a schematic and non-restrictive way. Shown here FIG. 1 an input and output device according to the invention, FIG. 2 the mounting of the input and output device according to the invention on a support plate, FIG. 3 a view of a connecting surface on a frame section made from a hollow profile, FIG. 4 a section through a sealing layer, FIG. 5 a finished sealing layer, and FIG. 6 a sealing layer with a covering overlaying it.

DETAILED DESCRIPTION OF THE EMBODIMENTS

Figure 1:
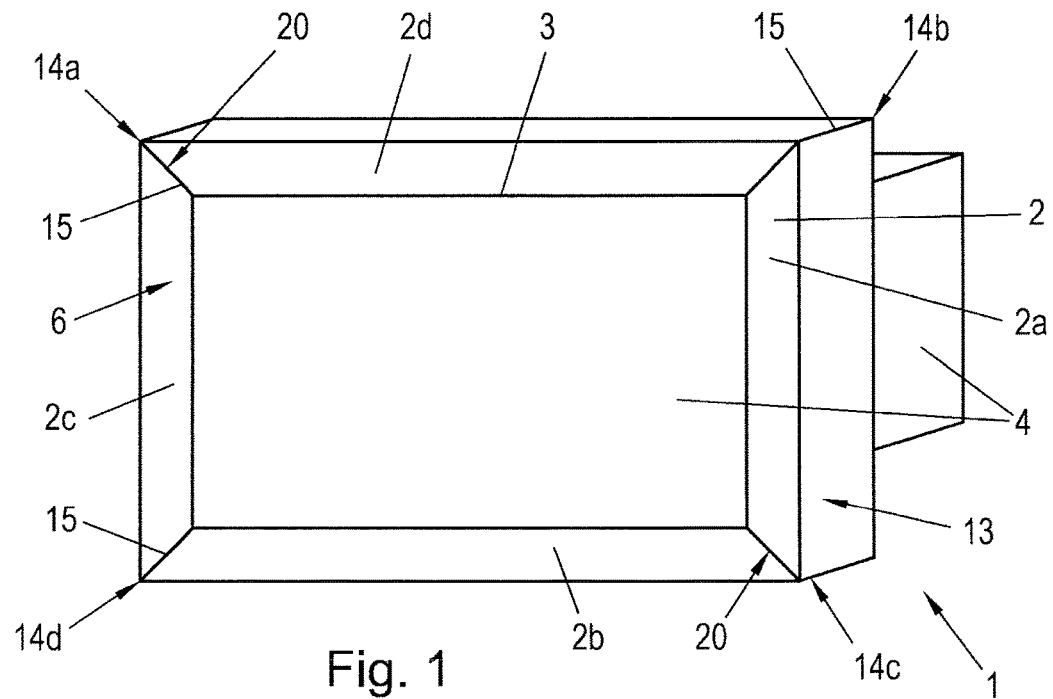

FIG. 1 shows an input and output device 1 according to the invention for an industrial environment with a frame 2 with a central, axial continuous recess 3 through the frame 2 in which the one input and output unit 4, e.g. a display, a touch screen, a unit with buttons, knobs or switches, or a combination of such elements, is set in. The input and output unit 4 can be inserted into the input and output device 1 in a wide variety of ways.

Figure 2:
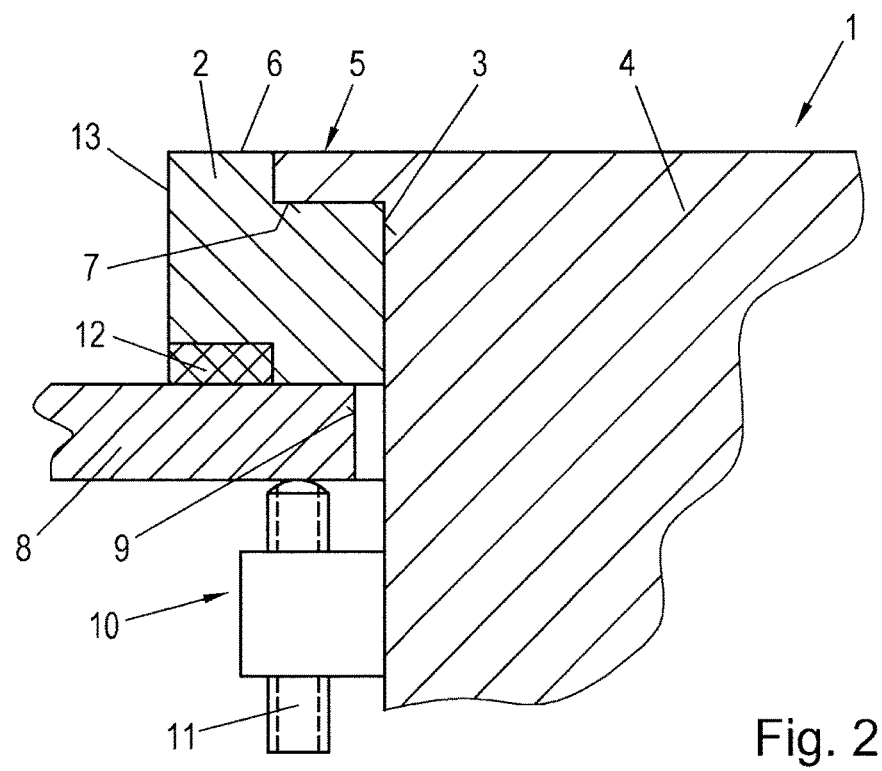

In the embodiment according to FIG. 2, the input and output unit 4 has an external peripheral (circumferential) ridge 5 running around the periphery (circumference). The frame 2 has a peripheral (circumferential) groove 7 complementary to the peripheral ridge 5 on its external front face 6, i.e. the front face which is visible during operational use of the input and output device 1, in which the peripheral ridge 5 is set in. The peripheral ridge 5 and peripheral groove 7 are preferably dimensioned such that a flush continuous external front face of the input and output device 1 is achieved, as indicated in FIG. 2. The input and output unit 4 can be glued between the peripheral ridge 5 and peripheral groove 7 in order to fix it in the frame 2. Suitable sealing elements, such as O-rings for example, can also be located between the peripheral groove 7 and peripheral ridge 5. However, it is also possible for the input and output unit 4 to be attached to the frame 2 in a different manner, e.g. with a screw, clamp or snap connection, or similar. Likewise, it is also possible for the input and output unit 4 to simply be inserted loose into and held in the frame 2.

The input and output device 1 is generally inserted into an assembly hole 9 in a support plate 8, e.g. in a control cabinet or a control panel of a machine, wherein the frame 2 lies flat on the support plate 8 and is connected to the support plate 8 via the frame 2, as shown in FIG. 2. A clamping fixture 10, for example, can be provided on the input and output unit 4 in the form of a screw 11. The frame 2 can be clamped to the support plate 8 via the screw 11 and the input and output device 1 can therefore be fixed. Likewise, a seal 12 can be located between the frame 2 and the support plate 8, as described in EP 2 590 489 A2, for example.

The frame 2 is made up of a plurality of individual frame sections 2a, 2b, 2c, 2d, and in the example according to FIG. 1 is made up of four frame sections. The frame sections 2a, 2b, 2c, 2d are preferably formed of profiles, e.g. made from metal or plastic, cut to the required length. The profiles can be solid or hollow profiles with essentially any desired cross section. It is preferably intended that the metal or plastic profiles which form the frame sections 2a, 2b, 2c, 2d are extruded profiles and/or pultruded profiles. Extrusion constitutes a particularly cost-effective and efficient manufacturing technique for appropriate profiles and is widely used for this reason. Such profiles are comparatively cost-effective and are available quickly and in sufficient quantities.

The frame sections 2a, 2b, 2c, 2d are connected to one another at the corners 14a, 14b, 14c, 14d of the frame 2. To this end, the frame sections 2a, 2b, 2c, 2d can be mitred at the corners 14a, 14b, 14c, 14d of the frame 2, as shown in FIG. 1. Instead of a mitre, the frame sections 2a, 2b, 2c, 2d, particularly when solid profiles are used, can simply be joined to one another edge to edge at the corners 14a, 14b, 14c, 14d. It is likewise possible for the frame sections 2a, 2b, 2c, 2d to be dovetailed at the corners 14a, 14b, 14c, 14d.

Each two adjoining frame sections 2a, 2b, 2c, 2d are firmly bonded (in the form of a substance-to-substance joint) to one another at their resulting facing connecting surfaces 15 (FIG. 3), e.g. mitred surfaces or dovetailed surfaces, whereby a bonding layer 20 is formed. A glued joint, a welded joint or a solder joint can be used for this.

Owing to the complex cross-sectional shape of the frame 2, for example with the peripheral groove 7 and the recess for the seal 12, and the small dimensions, the joining process is complicated in terms of production if the desired seal and a clean surface are to be achieved. The finished frame 2 must be fully sealed on the external front face 6 of the frame 2 and on the external peripheral (circumferential) surface 13 of the frame 2 for industrial use. Here, fully sealed means that no medium, such as spray or cleaning agent for example, can penetrate from outside into the interior of the input and output device 1.

Figure 3:
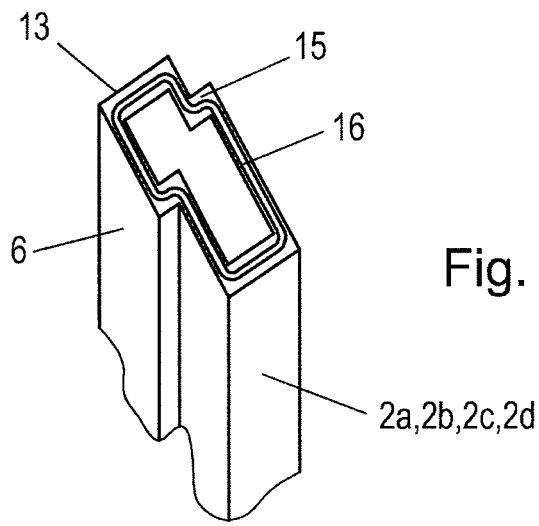

In the case of a glued joint, a suitable joining agent 16 (adhesive) is applied to at least one connecting surface 15 of the adjoining frame sections 2a, 2b, 2c, 2d (FIG. 3). The joining agent 16 is preferably applied to the connecting surface 15 continuously over the periphery. However, the joining agent 16 is at least applied such that the resulting bonding layer 20 is completely sealed in the area of the external front face 6 and the external peripheral surface 13 of the frame 2, i.e. the surfaces of the input and output device 1 which are visible during proper use, so that a completely sealed surface results on the external front face 6 of the frame 2 and on the external peripheral surface 13 of the frame 2 and the resulting bonding layer 20 in particular has no holes through which a medium, such as spray or cleaning agent for example, can penetrate from outside into the interior of the frame 2. After application of the adhesive, the adjoining frame sections 2a, 2b, 2c, 2d are pressed together using an appropriate device until the adhesive squeezes out on all sides. The adhesive is then cured and the glue joint is finished in order to achieve a clean surface. To this end, at least the external visible peripheral surface 13 and front face 6 should be finished in order to achieve a clean surface, in particular a continuous surface without any indentations or protrusions.

The same applies similarly in the case of a solder or welded joint. Here, too, the frame sections 2a, 2b, 2c, 2d are joined such that the resulting bonding layer 20 is completely sealed in the area of the external front face 6 and the external peripheral surface 13 of the frame 2, i.e. the surfaces of the input and output device 1 which are visible during proper use, so that a completely sealed surface results on the external front face 6 of the frame 2 and on the external peripheral surface 13 of the frame 2 and the resulting bonding layer 20 in particular has no holes through which a medium, such as spray or cleaning agent for example, can penetrate from outside into the interior of the frame 2. For a solder joint, solder can likewise protrude at the joint, and this should subsequently be at least partially removed in order to achieve a clean surface. A welded joint should also preferably be at least partially finished. To this end, at least the external visible peripheral surface 13 and front face 6 should be finished in order to achieve a clean surface, in particular a continuous surface without any indentations or protrusions.

The glued joint can preferably be realized using a thin-film process. The corresponding adhesive gaps between the individual frame sections 2a, 2b, 2c, 2d are small, preferably in the range of 0.05 mm to 0.2 mm, preferably 0.1 mm, and can very easily be completely filled with the adhesive used. The most homogeneous possible appearance without visible, external defects can thus be realized. Furthermore, with proper control of the adhesion process, there are no appreciable irregularities on the surface in the area of the joint, whereby the accumulation of dirt is also kept as low as possible in this area.

Ideally, the joining agent 16 is applied such that the joining agent 16 neither protrudes on the front face 6 (peripheral surface 13) nor forms a recess at this point.

Figures 4, 5:
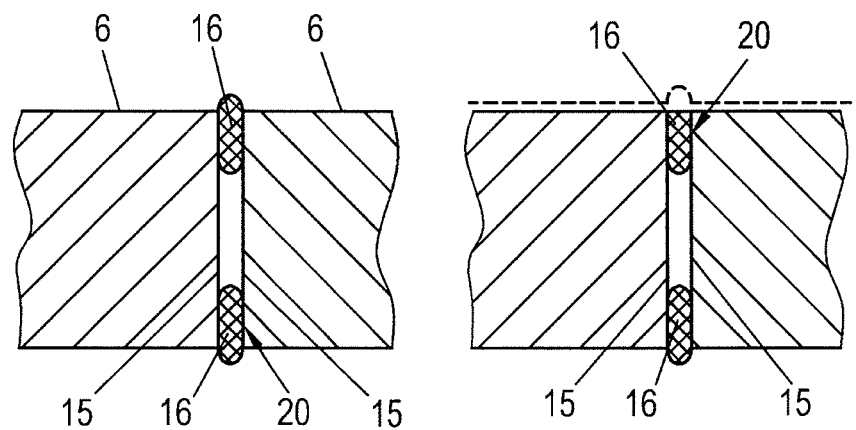

As shown in FIG. 4, however, a joining agent 16, for example an adhesive or fusible link etc., can deliberately be applied such that the joining agent 16 emerge at the front face 6 and the peripheral surface 13 during assembly of the frame sections 2a, 2b, 2c, 2d and protrudes from the front face 6 and from the peripheral surface 13. If an even external front face 6 and an even external peripheral surface 13 are desired then the joined frame 2 can also be finished, in particular machine finished, after joining, i.e. after adhesion and curing of the adhesive for example, in order to remove the protruding joining agent 16, as shown in FIG. 5. However, the removal of the protruding joining agent 16 before curing, e.g. by wiping or stripping it off, may suffice for finishing.

Figure 6:
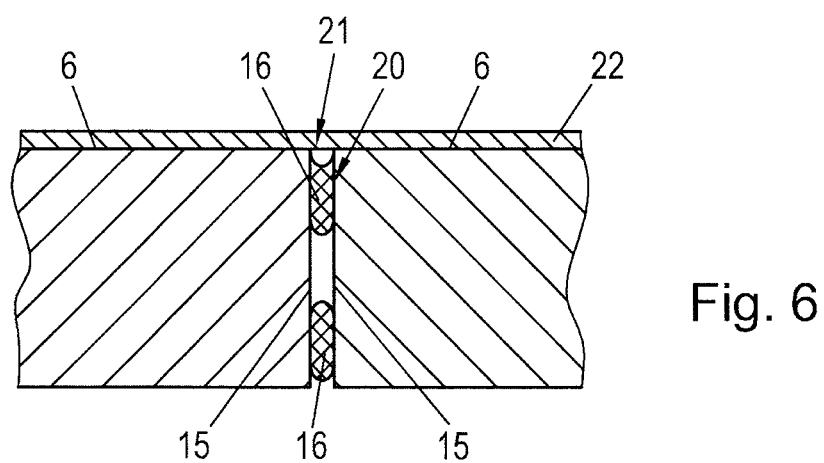

The joining agent 16 can also be applied such that the joining agent 16 does not emerge at the front face 6 and the peripheral surface 13 during assembly of the frame sections 2a, 2b, 2c, 2d, but rather a small recess 21 remains at this point, as shown in FIG. 6. If there are hygiene requirements for the input and output device 1 then such a recess 21 can be undesirable. In this case, it can be provided that a cover 22 is arranged on the front face 6 and/or on the peripheral surface 13 which covers at least the bonding layer 20. The cover 22 can be made as cover sheet, for example, which is glued onto the surface. Alternatively, the firmly bonded frame 2 can be coated, e.g. through powder coating, or painted at least in the area of the bonding layer 20, preferably in its entirety, on the external front face 6 and/or the peripheral surface 13 as the cover 22.

The application of a cover 22, e.g. in the form of a cover sheet, a coating or paintwork, can of course also occur on a frame as shown in FIG. 4 or 5. In this case, it may be possible to save on finishing of the frame 2 after joining.

The invention claimed is:

1. An input and output device for industrial use comprising:
    a frame that includes a plurality of individual frame sections having connecting surfaces, wherein adjoining connecting surfaces of the plurality of individual frame sections firmly bonded to one another at corners of the frame using a glue joint,
    wherein an adhesive gap in a range of 0.05 mm to 0.2 mm is formed between two adjoining frame sections and is filled with adhesive,
    wherein the adhesive, as a joining agent, forms a bonding layer which is fully sealed in an area of an external front face and an external peripheral surface of the frame in order to form a fully sealed external front face of the frame and a fully sealed external peripheral surface of the frame, and
    wherein the assembled frame includes a continuous central recess configured for an input/output unit to be set in.

2. The input and output device according to claim 1, wherein at least two adjoining frame sections are mitered or dovetailed in order to form the connecting surfaces.

3. The input and output device according to claim 1, wherein at least one of the external front face and the external peripheral surface is finished after joining with at least one of an even external front face and external peripheral surface by removing protruding joining agent.

4. The input and output device according to claim 1, further comprising a cover sheet that covers at least the bonding layer and is glued over at least one of the external front face and the external peripheral surface.

5. The input and output device according to claim 1, wherein, at least in the bonding area, at least one of the external front face and the external peripheral surface is painted or coated.

6. A method for the production of a frame which is sealed around a periphery for an input and output device for industrial use, the method comprising:
    assembling the frame from a plurality of individual frame sections that are connected to one another at corners of the frame,
    wherein the frame sections have connecting surfaces and are firmly bonded to one another at adjoining connecting surfaces using a glued joint, where an adhesive gap in a range of 0.05 mm to 0.2 mm is formed between two adjoining frame sections and is filled and cured with an adhesive as a joining agent, thereby forming a bonding layer which is fully sealed in an area of an external front face and an external peripheral surface of the frame in order to form a fully sealed external front face of the frame and a fully sealed external peripheral surface of the frame.

7. The method according to claim 6, further comprising at least partially finishing a joint in order to form a flawless surface.

8. The method according to claim 7, further comprising removing joining agent escaping from the adhesive gap before curing.

9. A method for production of an input and output device for industrial use with a frame that is sealed around a periphery and that is manufactured according to claim 6, the method comprising:
    inserting an input/output unit into a continuous central recess in the frame.

* * * * *